(12) United States Patent
Choi et al.

(10) Patent No.: US 9,372,237 B2
(45) Date of Patent: Jun. 21, 2016

(54) BATTERY PACK HAVING STABLE MEASURING UNIT

(71) Applicant: LG CHEM, LTD., Seoul (KR)

(72) Inventors: JunSeok Choi, Daejeon (KR); Yong Shik Shin, Daejeon (KR); Jong Moon Yoon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 408 days.

(21) Appl. No.: 13/948,856

(22) Filed: Jul. 23, 2013

(65) Prior Publication Data

US 2013/0308679 A1 Nov. 21, 2013

Related U.S. Application Data

(63) Continuation of application No. PCT/KR2012/001514, filed on Feb. 29, 2012.

(30) Foreign Application Priority Data

Mar. 10, 2011 (KR) ........................ 10-2011-0021312

(51) Int. Cl.
*G01K 1/08* (2006.01)
*G01K 1/14* (2006.01)
*G01K 13/00* (2006.01)
(Continued)

(52) U.S. Cl.
CPC ......... *G01R 31/3606* (2013.01); *B60L 11/1879* (2013.01); *H01M 10/482* (2013.01); *H01M 10/486* (2013.01); *H01M 10/425* (2013.01); *H01M 10/48* (2013.01); *Y02T 10/7005* (2013.01); *Y02T 10/705* (2013.01)

(58) Field of Classification Search
USPC ................. 374/141, 152, 183, 208, 110, 166; 320/150
See application file for complete search history.

(56) References Cited

U.S. PATENT DOCUMENTS

| 5,644,209 A | 7/1997 | Chabbert et al. |
| 5,926,419 A | 7/1999 | Van Phuoc et al. |

(Continued)

FOREIGN PATENT DOCUMENTS

| CN | 101395490 A | 3/2009 |
| JP | 08-506477 A | 7/1996 |

(Continued)

OTHER PUBLICATIONS

PCT/ISA/210—International Search Report mailed on Sep. 26, 2012, issued in PCT/KR2012/001514.

*Primary Examiner* — Mirellys Jagan
(74) *Attorney, Agent, or Firm* — Birch, Stewart, Kolasch & Birch, LLP

(57) ABSTRACT

Disclosed herein is a battery pack including a battery module having a battery cell stack structure in which at least two electrically connected battery cells or unit modules are stacked, a voltage measuring member that measures voltage at an electrode terminal connection part of the battery cells or the unit modules, a voltage measuring circuit that connects the voltage measuring member to a Battery Management System (BMS), a temperature measuring member that measures temperature of the battery cells or the unit modules, a temperature measuring circuit that connects the temperature measuring member to the BMS and that is separated from the voltage measuring circuit, and the BMS electrically connected to the voltage measuring member to control operation of the battery modules.

19 Claims, 10 Drawing Sheets

(51) Int. Cl.
  *G01K 7/16*   (2006.01)
  *G01R 31/36*  (2006.01)
  *B60L 11/18*  (2006.01)
  *H01M 10/48*  (2006.01)
  *H01M 10/42*  (2006.01)

(56) References Cited

U.S. PATENT DOCUMENTS

| | | | | |
|---|---|---|---|---|
| 7,059,769 | B1* | 6/2006 | Potega | B60L 11/1861 |
| | | | | 338/22 R |
| 8,410,760 | B2* | 4/2013 | Formanski | H01M 10/443 |
| | | | | 320/104 |
| 8,823,323 | B2 | 9/2014 | Troxel et al. | |
| 2003/0122527 | A1 | 7/2003 | Yugo et al. | |
| 2004/0212342 | A1* | 10/2004 | Batson | H02J 7/0047 |
| | | | | 320/107 |
| 2005/0104558 | A1 | 5/2005 | Murakami et al. | |
| 2006/0177733 | A1* | 8/2006 | Ha | H01M 2/0212 |
| | | | | 429/159 |
| 2006/0216600 | A1* | 9/2006 | Inagaki | H01M 2/06 |
| | | | | 429/231.1 |
| 2007/0072066 | A1* | 3/2007 | Yoon | H01M 2/1077 |
| | | | | 429/99 |
| 2008/0192800 | A1* | 8/2008 | Asada | G01K 1/16 |
| | | | | 374/141 |
| 2009/0214936 | A1 | 8/2009 | Yang et al. | |
| 2009/0325043 | A1* | 12/2009 | Yoon | H01M 2/1072 |
| | | | | 429/90 |
| 2010/0021802 | A1 | 1/2010 | Yang et al. | |
| 2011/0159336 | A1* | 6/2011 | Ohkura | H01M 2/1077 |
| | | | | 429/99 |
| 2012/0019061 | A1* | 1/2012 | Nishihara | H01M 2/1077 |
| | | | | 307/10.1 |
| 2012/0169117 | A1* | 7/2012 | Park | B60L 11/1861 |
| | | | | 307/10.7 |
| 2012/0208410 | A1 | 8/2012 | Ikeda et al. | |
| 2013/0078487 | A1* | 3/2013 | Shin | H01M 10/482 |
| | | | | 429/62 |
| 2013/0314094 | A1* | 11/2013 | Farmer | G01N 25/20 |
| | | | | 324/430 |

FOREIGN PATENT DOCUMENTS

| | | |
|---|---|---|
| JP | 2001-6685 A | 1/2001 |
| JP | 2003-045387 A | 2/2003 |
| JP | 2003-199258 A | 7/2003 |
| JP | 2009-277420 A | 11/2009 |
| JP | 2010-104222 A | 5/2010 |
| JP | 2011-40332 A | 2/2011 |
| KR | 10-2004-0071248 A | 8/2004 |
| KR | 10-2007-0114409 A | 12/2007 |
| WO | WO 95/15023 A1 | 6/1995 |
| WO | WO 99/31752 A1 | 6/1999 |
| WO | WO 2010/047255 A1 | 4/2010 |

* cited by examiner

BATTERY PACK HAVING STABLE MEASURING UNIT

CROSS REFERENCE TO RELATED APPLICATIONS

This application is a Bypass Continuation of PCT International Application No. PCT/KR2012/001514 filed on Feb. 29, 2012, which claims priority under 35 U.S.C §119(a) to Patent Application No. 10-2011-0021312 filed in the Republic of Korea on Mar. 10, 2011, all of which are hereby expressly incorporated by reference into the present application.

TECHNICAL FIELD

The present invention relates to a battery pack having a stable measuring unit and, more particularly, to a battery pack including a battery module having a battery cell stack structure in which at least two electrically connected battery cells or unit modules are stacked, a voltage measuring member that measures voltage at an electrode terminal connection part of the battery cells or the unit modules, a voltage measuring circuit that connects the voltage measuring member to a Battery Management System (BMS), a temperature measuring member that measures the temperature of the battery cells or the unit modules, a temperature measuring circuit that connects the temperature measuring member to the BMS and that is separated from the voltage measuring circuit, and the BMS electrically connected to the voltage measuring member to control operation of the battery modules.

BACKGROUND ART

Recently, secondary batteries, which can be charged and discharged, have been widely used as energy sources for wireless mobile devices. Secondary batteries have also attracted considerable attention as power sources for electric vehicles (EV), hybrid electric vehicles (HEV) and plug-in hybrid electric vehicles (Plug-in HEV), which have been developed to solve problems, such as air pollution, caused by existing gasoline and diesel vehicles that use fossil fuels.

Small-sized mobile devices use one or several battery cells for each device. On the other hand, middle or large-sized devices such as vehicles use a battery module having a number of battery cells electrically connected to each other because high power and large capacity are necessary for the middle or large-sized devices.

Since the battery module is preferably manufactured to have as small a size and weight as possible, prismatic batteries or pouch-shaped batteries, which can be stacked with high integration and have a small weight to capacity ratio, are usually used as battery cells of middle or large-sized battery modules. In particular, much interest is currently focused on pouch-shaped batteries, which use an aluminum laminate sheet as a sheathing member, due to their advantages of being lightweight and cheap to manufacture.

Since a battery module is made up by combining a number of battery cells, safety and operating efficiency of the battery module are considerably deteriorated when overvoltage, overcurrent or overheat occurs at some of the battery cells. Therefore, it is necessary to provide a unit to sense and control such overvoltage, overcurrent or overheat. Thus, measuring members such as voltage measuring members and temperature measuring members are connected to the battery cells to check and control operating states of the battery cells in real time or at predetermined intervals. However, installation or connection of such measuring members greatly complicates the process of assembling the battery module and may cause a short circuit due to use of many wires.

In this regard, referring to FIG. 11, a conventional battery pack is configured such that voltage measuring members and temperature measuring members are connected to a connector (CNT) and a battery management system (BMS) via wiring harnesses and a temperature measuring circuit is formed along a voltage measuring circuit.

However, such a battery pack structure has a problem in that the insulation resistance of the voltage measuring circuit is reduced as an electrical connection is formed between the voltage and temperature measuring circuits by water. Another problem is that temperature measurements may change, with the result that it is not possible to correctly measure voltage and temperature.

In addition, when a battery module is constructed using a plurality of battery cells or is constructed using a plurality of unit modules, each including a specific number of battery cells, it is generally necessary to provide a large number of members for mechanical coupling and electrical connection between the battery cells or the unit modules and therefore the process of assembling such members is very complicated. Furthermore, spaces for coupling, welding, or soldering of the members are needed to achieve such mechanical coupling and electrical connection, thereby increasing overall system size. Such size increase is undesirable as previously described. Accordingly, there is a high necessity for a battery module which is more compact and exhibits high structural stability and which is also capable of correctly measuring temperature and voltage.

DISCLOSURE

Technical Problem

Therefore, the present invention has been made to solve the above and other technical problems that have yet to be resolved.

Specifically, it is an object of the present invention to provide a battery pack structure in which a voltage measuring circuit and a temperature measuring circuit are separated from each other to prevent the formation of an electrical connection between the two circuits by water.

It is another object of the present invention to provide a battery pack structure that includes a battery module having a voltage measuring member that can be manufactured through a simple assembly method without using a number of members for mechanical coupling and electrical connection.

It is another object of the present invention to provide a battery pack including battery modules having voltage measuring members, each of which is formed as a separate structure to improve productivity and maintenance of the battery modules.

Technical Solution

A battery pack according to the present invention to achieve the above and other objects includes a battery module having a battery cell stack structure in which at least two electrically connected battery cells or unit modules are stacked, a voltage measuring member that measures voltage at an electrode terminal connection part of the battery cells or the unit modules, a voltage measuring circuit that connects the voltage measuring member to a Battery Management System (BMS), a temperature measuring member that measures the temperature of the battery cells or the unit modules, a temperature measuring circuit that connects the temperature measuring member to the BMS, the temperature measuring circuit being separated from the voltage measuring circuit, and the BMS electrically connected to the voltage measuring member to control operation of the battery modules.

This battery pack structure is desirable in terms of safety of the battery pack since each of the battery modules includes not only the voltage measuring member to measure voltage of each of the battery modules but also the temperature measuring member to measure and control battery cell temperature, thereby preventing the battery module from exploding or catching fire.

In the battery pack structure, the voltage measuring circuit is configured such that the voltage measuring member is connected to the BMS and the temperature measuring circuit is separated from the voltage measuring circuit and configured such that the temperature measuring member is directly connected to the BMS, thereby preventing temperature measurement change and insulation resistance reduction of the voltage measuring circuit by water. As a result, it is possible to correctly measure voltage and temperature. Thus, the battery pack structure is more desirable in terms of safety (or stability) of the battery pack.

The electrical connection between the battery cells or the unit modules may be series and/or parallel.

Each of the battery cells may be a plate-shaped battery cell having electrode terminals formed respectively at upper and lower ends of the battery cell. Electrode terminals of two or more battery cells may be connected in series to each other and a connection portion between the electrode terminals may be bent so that the battery cells are arranged in a stacked structure.

Each of the plate-shaped battery cells has a small thickness and a relatively large width and length so as to minimize the overall size of the battery module when the plate-shaped battery cells are stacked to form the battery module. A preferred example of the plate-shaped battery cell is a secondary battery structured such that a battery case formed of a laminate sheet including a resin layer and a metal layer, in which an electrode assembly is mounted, is sealed around the perimeter of the case and electrode terminals protrude from upper and lower ends of the battery cell. Specifically, the plate-shaped battery cell may be structured such that an electrode assembly is mounted in a pouch-shaped case formed of an aluminum laminate sheet. This type of secondary battery may also be referred to as a pouch-shaped battery cell.

Each unit module may be constructed by covering two or more such battery cells with a high-strength module cover formed of a synthetic resin or a metallic material. The high-strength cell cover protects battery cells having a low mechanical strength while inhibiting repetitive changes of the battery cells such as expansion and contraction during charge/discharge, thereby preventing separation of sealing portions of the battery cells. Consequently, it is possible to manufacture middle or large-sized battery modules with higher safety.

A unit module is structured such that plate-shaped battery cells having electrode terminals formed respectively at upper and lower ends thereof are connected in series. For example, the unit module may include two or more battery cells structured such that a connection portion between electrode terminals of the battery cells is bent so that the battery cells are arranged in a stacked structure and a pair of high-strength module covers that are coupled to each other so as to cover the outside of the battery cells excluding the electrode terminals.

Battery cells of a unit module or battery cells of unit modules are connected in series or in parallel. In a preferred example, a plurality of unit modules may be manufactured by coupling electrode terminals of battery cells to each other in a state in which the battery cells are arranged in series in a longitudinal direction such that the electrode terminals of the battery cells are successively adjacent to each other, folding the arrangement of battery cells into groups of two or more overlapping battery cells, and covering each group of battery cells with a cell cover.

The electrode terminals may be coupled to each other using various methods such as welding, soldering, or mechanical coupling. Preferably, the electrode terminals are connected to each other using welding.

A battery pack according to the present invention may include a plurality of temperature measuring members for measuring the temperature of the battery module, which are mounted between battery cells or unit modules. This allows the battery pack to sense and control excessive temperature increase, thereby effectively preventing the battery modules from catching fire or exploding. Each of the temperature measuring members may be a thermistor.

In a preferred example, the temperature measuring members are electrically connected directly to the BMS to form a temperature measuring circuit. The temperature measuring circuit may include a line of a voltage lower than a line of the voltage measuring circuit. That is, the voltage measuring circuit may include a line of a high voltage of, for example, 10 to 300V since the voltage measuring circuit is set according to voltage of the battery pack, whereas the temperature measuring circuit may include a line of a low voltage of, for example, 2 to 7V.

According to the present invention, the temperature measuring circuit is spatially separated from the voltage measuring circuit. Since the temperature measuring circuit is spatially separated from the voltage measuring circuit, wirings of the circuits are simple, thereby improving productivity, and there is no risk of disconnection due to tangling of the circuits, thereby improving battery safety. The expression "spatially separated" indicates that the temperature measuring circuit and the voltage measuring circuit are spaced from each other at a distance where no electrical interference occurs. For example, as shown in FIG. 9, the temperature measuring circuit may be connected to the BMS along a middle region of the battery pack and the voltage measuring circuit may be connected to the BMS along opposite ends of the battery pack.

In a preferred example, the battery module may include (a) a battery cell stack having a plurality of series or parallel-connected battery cells or unit modules which are stacked in a lateral direction with each battery cell or unit module oriented upright, the battery cell stack being provided at the front thereof with bus bars for connecting electrode terminals of the battery cells to external input and output terminals, (b) voltage measuring members provided at ends thereof with connection terminals that are electrically connected to electrode terminal connection parts of the battery cells located at the front and rear of the battery cell stack to measure voltages of the battery cells or the unit modules, (c) an upper case that covers the top of the battery cell stack and parts of the front and rear of the battery cell stack, the upper case being provided with mounting parts for inserting and mounting the voltage measuring members therein, and (d) a lower case coupled to the upper case while covering the bottom of the battery cell stack and parts of the front and rear of the battery cell stack, the lower case being provided at the front thereof with external input and output terminals.

In the battery module, the voltage measuring members are electrically connected to the electrode terminal connection parts of the battery cells located at the front and rear of the battery cell stack in a state in which the voltage measuring members are inserted into and mounted within the mounting parts located at the front and rear of the upper case (i.e., located at opposite ends of the battery module). Therefore, the process of assembling the voltage measuring members is very simple and the voltage measuring members have a compact structure to reliably measure voltage.

Since each of the voltage measuring members for measuring voltage of the battery cells is formed as a modular structure, the voltage measuring members can be easily mounted to the front or the rear of the battery module and a middle connection part of the voltage sensing (measuring) structure is minimized, thereby improving reliability in voltage sensing (measurement).

In addition, the simplified structure of the voltage measuring members, each of which is configured as a separate unit, reduces manufacturing costs and allows manufacturing of the voltage measuring members to be outsourced, thereby greatly improving productivity of battery modules.

When the voltage measuring members malfunction, the voltage measuring members mounted to the front and rear of the battery module can be replaced without disassembly of the battery module, thereby greatly improving maintenance of the battery module as compared with the conventional battery module structure.

Furthermore, since the mounting parts for mounting voltage measuring members are formed at the upper case, it is possible to selectively mount the voltage measuring members to each battery module as needed after assembly of the battery module and therefore it is possible to configure voltage measuring members having a more compact structure than the conventional battery module structure in which the voltage measuring members are mounted in the lower case.

The battery cell stack, in which the battery cells are stacked with high integration in a state in which the electrode terminals of the battery cells are connected to each other, is vertically mounted within upper and lower separable cases which are coupled to each other in an assembly-type coupling structure.

When the upper and lower cases are coupled to each other after the battery cell stack is mounted in the upper and lower cases, the upper and lower cases preferably cover only the perimeter of the battery cell stack so that outer surfaces of the battery cell stack are exposed to the outside of the upper and lower cases to easily dissipate heat from the battery cell stack. As previously described, therefore, the upper case covers the top of the battery cell stack and parts of the front and rear of the battery cell stack and the lower case covers the bottom of the battery cell stack and parts of the front and rear of the battery cell stack.

On the other hand, in a battery module constructed of a plurality of unit modules, it is necessary to measure and control voltage in consideration of safety and operating efficiency of the battery module. In particular, it is necessary to perform voltage measurement for each unit module or for each electrical connection part of the unit modules. However, the installation of measuring members such as voltage measuring members is one of the main causes of complication of the structure of the battery module.

In the battery module according to the present invention, the voltage measuring members are mounted in the mounting parts of the upper case, thereby solving such problems. That is, the voltage measuring members are inserted into and mounted within the mounting parts located respectively at the front and rear of the upper case.

The structure of the voltage measuring members is not particularly restricted so long as the voltage measuring members are electrically connected to the electrode terminal connection parts of the battery cells to easily sense voltages of the battery cells or the unit modules. In a preferred example, the voltage measuring members may include a front measuring member connected to the electrode terminal connection parts located at the front of the battery cell stack and a rear measuring member connected to the electrode terminal connection parts located at the rear of the battery cell stack.

Accordingly, the front measuring member and the rear measuring member are easily electrically connected to the electrode terminal connection parts located at the front and rear of the battery cell stack simply by inserting the front measuring member and the rear measuring member into the respective mounting parts of the upper case.

Preferably, each of the front measuring member and the rear measuring member includes a main body, which is formed in the shape of a connector having a hollow structure, and connection terminals which are connected respectively to the bent series-connection portions (i.e., the electrode terminal connection parts) of the electrode terminals of the battery cells with the connection terminals being fitted in the main body.

In an example of the above structure, the lower portion of each of the main bodies has a divided structure such that the connection terminals are fitted in the main bodies, respectively, for the electrode terminal connection parts. Accordingly, the connection terminals of the voltage measuring members fitted in the lower portions, each having a divided structure, of the main bodies are easily electrically connected respectively to the electrode terminal connection parts of the battery cells located at the front and rear of the battery cell stack.

The number of divided parts of the lower portion of each of the main bodies of the front measuring member and the rear measuring member may be varied depending upon the number of the unit modules of the battery module, the series or parallel-connection structure of the unit modules, or the shape of the bus bars. For example, when the battery cell stack includes four unit modules (i.e., eight battery cells) which are stacked in a lateral direction with each unit module oriented upright, the lower portion of the main body of the front measuring member may be divided into three parts and the lower portion of the main body of the rear measuring member may be divided into four parts such that the connection terminals of the front measuring member and the rear measuring member can be connected to the respective electrode terminal connection parts located at the front and rear of the battery cell stack.

In another example of the above structure, the connection terminals may have a receptacle structure such that the connection terminals are inserted into the electrode terminal connection parts from above. This structure is desirable since electrical connection between the connection terminals of the voltage measuring members and the electrode terminal connection parts of the battery cells can be stably maintained even when external impact is applied to the battery module.

The mounting parts are formed respectively at the front and rear of the upper case such that the mounting parts are upwardly open. This structure is very desirable in terms of assembly efficiency since electrical connection between the voltage measuring members and the electrode terminal connection parts is achieved by inserting the voltage measuring members into the respective mounting parts from above after assembly of the battery module.

The upper case has slits for coolant circulation at the top thereof and the temperature measuring circuit is connected to the temperature measuring members mounted between the battery cells or the unit modules through the slits.

The upper end of each of the temperature measuring members may protrude upward through a slit of the upper case or downward through a slit of the lower case to easily electrically connect the temperature measuring members.

This structure is desirable since the temperature measuring member may be selectively inserted through a slit of the upper case or the lower case based on the installation position of the battery module in a vehicle.

The lower case is provided at the front thereof with a pair of slits for insertion of the bus bars connected to the outermost electrode terminals of the battery cell stack, thereby allowing the bus bars to be easily mounted to the lower case.

Each of the bus bars may include an electrode terminal contact portion electrically connected to a corresponding one of the outermost electrode terminals of the battery module and an input and output terminal contact portion connected to a corresponding one of the external input and output terminals of the lower case. The input and output terminal contact portion may be bent substantially perpendicular to the electrode terminal contact portion toward the interior of the battery module.

The bus bars having the above structure are desirable since the bus bars can be simultaneously connected to the outermost electrode terminals of the battery module and the external input and output terminals of the lower case.

In the above structure, the input and output terminal contact portion of each of the bus bars may have an inwardly recessed region at a lower portion thereof and a corresponding one of the external input and output terminals may be fitted in the recessed region, thereby achieving electrical connection to the bus bar. This effectively prevents the bus bars from being dislocated after the bus bars are electrically connected to the external input and output terminals.

Where appropriate, a front insulating cover formed of an insulating material may be provided to close each of the voltage measuring members, which are upwardly open, from the outside. In this case, the front insulating cover may be provided at the front of the upper case. The insulating cover may be formed integrally at the upper case rather than being provided as a separate component for closing the voltage measuring member from the outside.

Where appropriate, the battery pack may further include an air temperature measuring member to measure the temperature of air in a coolant inlet portion.

Generally, the battery pack is structured such that a coolant flows in the battery pack to cool the battery pack. In this case, it is important to measure the temperature of the coolant inlet portion since the cooling efficiency of the battery pack depends upon the temperature of the coolant inlet portion. Accordingly, the installation structure of the air temperature measuring member as described above is very desirable in terms of battery pack safety.

The middle or large-sized battery pack according to the present invention may be manufactured by combining battery modules according to desired power and capacity. In consideration of installation efficiency and structural stability as previously described, the middle or large-sized battery pack according to the present invention is preferably used as a power source for vehicles, such as electric vehicles, hybrid electric vehicles and plug-in hybrid electric vehicles, which have a limited installation space and which are exposed to frequent vibration and strong impact.

BRIEF DESCRIPTION OF THE DRAWINGS

The above and other objects, features and other advantages of the present invention will be more clearly understood from the following detailed description taken in conjunction with the accompanying drawings, in which.

BEST MODE

Now, embodiments of the present invention will be described in detail with reference to the accompanying drawings. However, it should be noted that the description of the embodiments is to provide better understanding of the present invention without limiting the scope of the invention.

Figure 1:
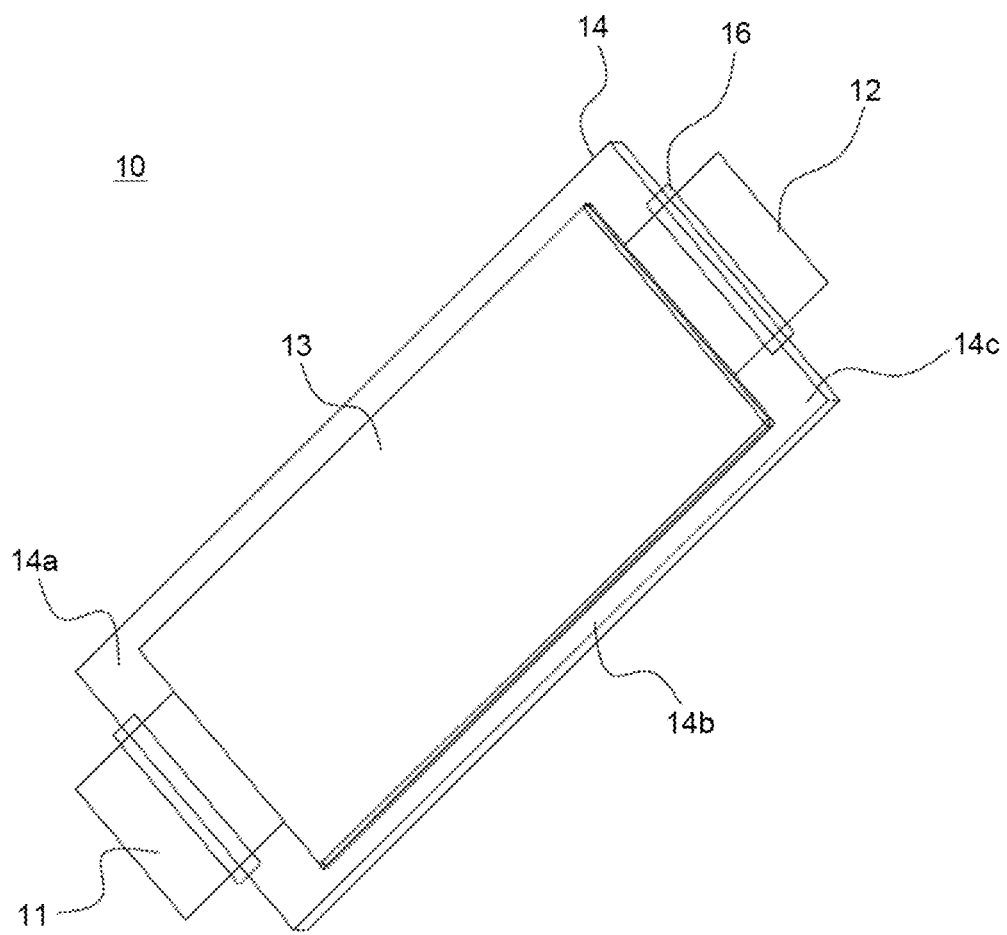
FIG. 1 is a perspective view of a plate-shaped battery cell which is to be mounted in a battery module.

FIG. 1 is a schematic perspective view of an exemplary plate-shaped battery cell which is to be mounted in a unit module according to the present invention.

As shown in FIG. 1, a plate-shaped battery cell 10 is structured such that two electrode leads 11 and 12 protrude respectively from the upper and lower ends of a battery body 13 so that the electrode leads 11 and 12 are opposite to each other. A sheathing member 14 includes upper and lower sheathing parts. That is, the sheathing member 14 is a two-unit member. In a state in which an electrode assembly (not shown) is mounted within a receiving part defined between the upper and lower sheathing parts of the sheathing member 14, opposite sides 14b, upper ends 14a and lower ends 14c of the upper and lower sheathing parts of the sheathing member 14, which are contact regions of the upper and lower sheathing parts, are bonded to each other to form the battery cell 10. The sheathing member 14 has a laminate structure of a resin layer, a metal foil layer, and a resin layer. Thus, it is possible to bond the opposite sides 14b and the upper and lower ends 14a and 14c of the upper and lower sheathing parts of the sheathing member 14, which are in contact with each other, to each other by applying heat and pressure to the opposite sides 14b and the upper and lower ends 14a and 14c to weld the resin layers thereof to each other. Where appropriate, the opposite sides 14b and the upper and lower ends 14a and 14c of the upper and lower sheathing parts of the sheathing member 14 may be bonded to each other using a bonding agent. The same resin layers of the upper and lower sheathing parts of the sheathing member 14 are in direct contact with each other at the opposite sides 14b. Therefore, the upper and lower sheathing parts of the sheathing member 14 can be uniformly sealed at the opposite sides 14b by welding. On the other hand, the electrode leads 11 and 12 protrude from the upper and lower ends 14a and 14c of the sheathing member 14, respectively. Therefore, the upper and lower ends 14a and 14c of the upper and lower sheathing parts of the sheathing member 14 are thermally welded to each other in a state in which a film type sealing member 16 is interposed between the electrode leads 11 and 12 and the sheathing member 14 to improve sealability of the sheathing member 14 in consideration of the thickness of the electrode leads 11 and 12 and the material difference between the electrode leads 11 and 12 and the sheathing member 14.

Figure 2:
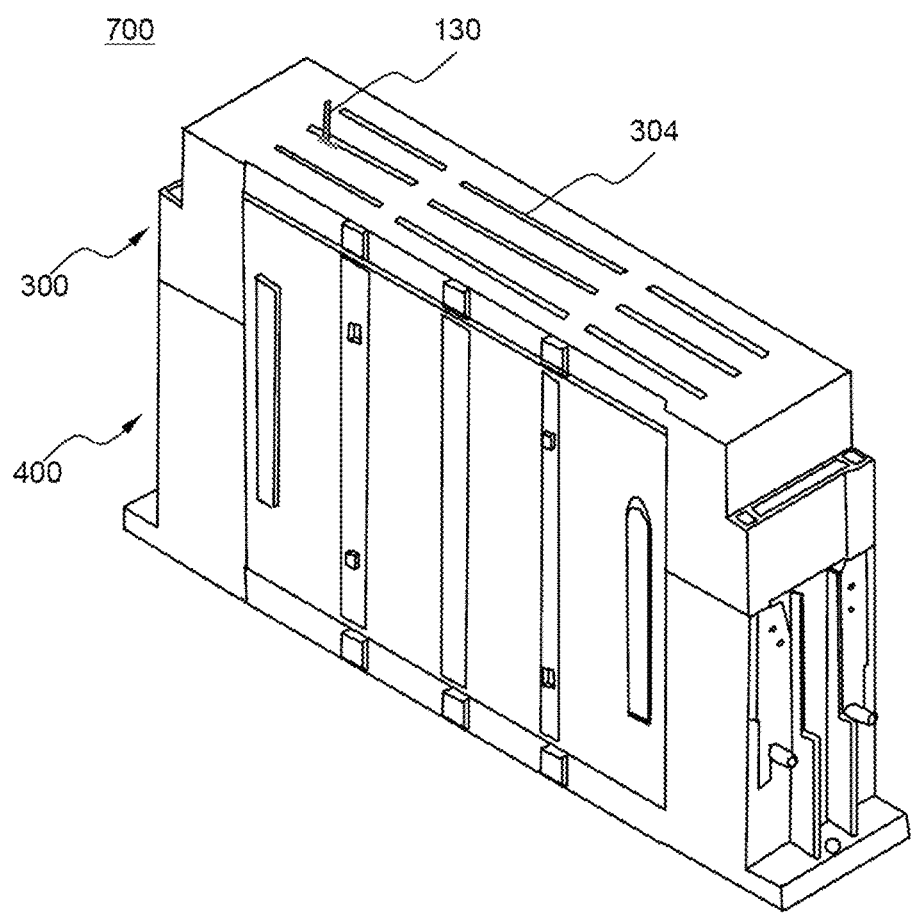
FIG. 2 is a perspective view of a battery module according to an embodiment of the present invention.
Figure 3:
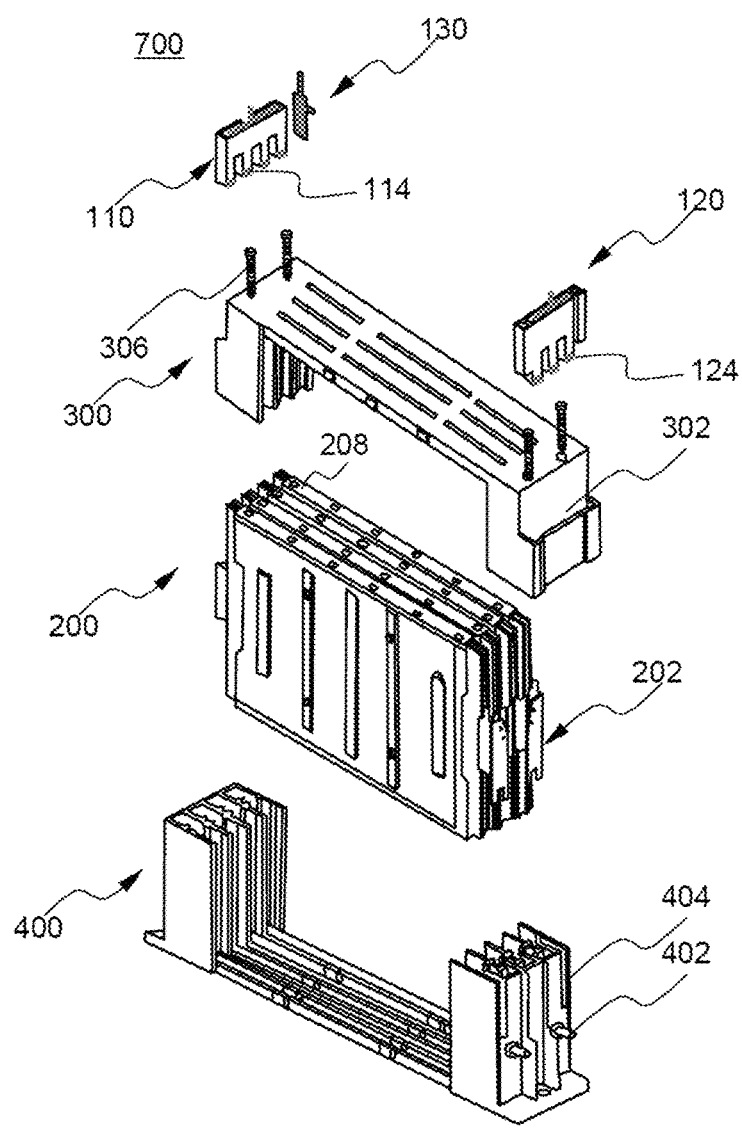
FIG. 3 is a schematic exploded view of the battery module of FIG. 2.

FIG. 2 is a schematic perspective view of a battery module according to an embodiment of the present invention and FIG. 3 is a schematic exploded view of the battery module of FIG. 2.

Figure 4:
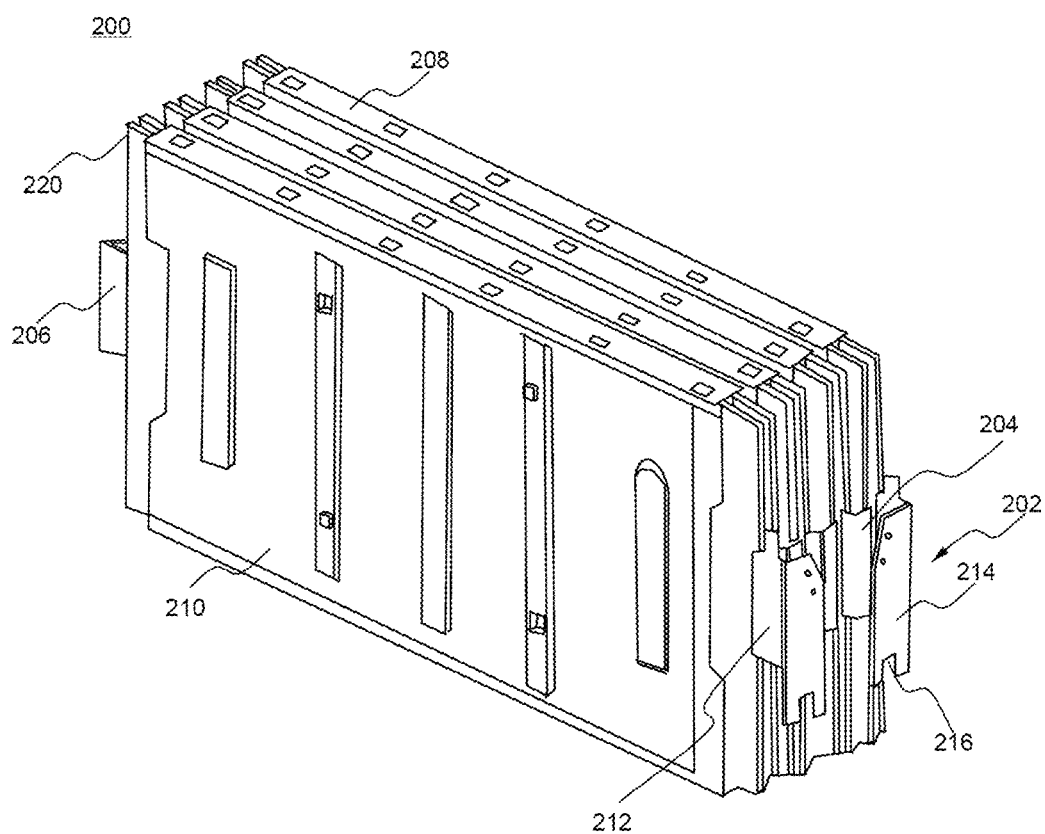
FIG. 4 is a perspective view of a battery cell stack of the battery module of FIG. 3.

Referring to FIGS. 2 and 3 together with FIG. 4, a battery module 700 includes a battery cell stack 200, voltage measuring members 110 and 120, an upper case 300 and a lower case 400.

The battery cell stack 200 includes four series-connected unit modules 208 which are stacked in a lateral direction with each unit module oriented upright. The battery cell stack 200 is also provided at the front thereof with bus bars 202 for connecting electrode terminals of battery cells 220 to external input and output terminals 402 of the lower case 400.

The voltage measuring members 110 and 120 are provided at the respective lower ends thereof with connection terminals 114 and 124 that are electrically connected to electrode terminal connection parts 204 and 206 of the unit modules 208 located at the front and rear of the battery cell stack 200 to sense voltages of the unit modules 208.

The voltage measuring members 110 and 120 include a front measuring member 120 electrically connected to the electrode terminal connection parts 204 located at the front of the battery cell stack 200 and a rear measuring member 110 electrically connected to the electrode terminal connection parts 206 located at the rear of the battery cell stack 200.

The upper case 300 covers the top of the battery cell stack 200 and parts of the front and rear of the battery cell stack 200. The upper case 300 is provided at the front and rear thereof with voltage measuring member mounting parts 302 for inserting and mounting the voltage measuring members 110 and 120 therein, respectively.

The lower case 400 is coupled to the upper case 300 by bolts 306 while covering the bottom of the battery cell stack 200 and parts of the front and rear of the battery cell stack 200. The lower case 400 is provided at the front thereof with external input and output terminals 402.

The battery module 700 according to the present invention is structured such that the voltage measuring members 110 and 120 are inserted into the voltage measuring member mounting parts 302 of the upper case 300 after the upper case 300 is coupled to the lower case 400, in which the battery cell stack 200 has been mounted, by the bolts 306. Therefore, the voltage measuring members 110 and 120 can be replaced without disassembly of the battery module 700 when the voltage measuring members 110 and 120 malfunction, thereby greatly improving maintenance of the battery module, as compared with the conventional battery module structure in which the upper case is coupled to the lower case by bolts after voltage measuring members are mounted in the lower case.

In addition, a battery module temperature measuring member 130 such as a thermistor is mounted between the unit modules 208 to measure the temperature of the battery module 700. The upper end of the battery module temperature measuring member 130 protrudes upward through a slit 304 of the upper case 300.

When the temperature measuring member 130 malfunctions, the temperature measuring member 130 can be replaced without disassembly of the battery module 700, thereby improving maintenance of the battery module as compared with the conventional battery module structure.

FIG. 4 is a schematic perspective view of the battery cell stack in the battery module of FIG. 3.

Referring to FIG. 4 together with FIG. 3, the battery cell stack 200 includes four unit modules 208. Each of the unit modules 208 includes two plate-shaped battery cells 220, each having electrode terminals formed respectively at the upper and lower ends thereof.

Specifically, each of the unit modules 208 includes two battery cells 220, which are structured such that their electrode terminals are connected in series while a connection portion 204 between the electrode terminals is bent so that the battery cells 200 are arranged in a stacked structure, and a pair of high-strength cell covers 210 which are coupled to each other so as to cover the entire outside of the battery cell stack 200 excluding the electrode terminals of the battery cells 220.

Each of the bus bars 202 includes an electrode terminal contact portion 212 electrically connected to a corresponding one of the outermost electrode terminals of the battery module 700 and an input and output terminal contact portion 214 electrically connected to a corresponding one of the external input and output terminals 402 of the lower case 400.

The input and output terminal contact portion 214 is bent substantially perpendicular to the electrode terminal contact portion 212 toward the interior of the battery module 700. The input and output terminal contact portion 214 also has an inwardly recessed region 216 at a lower portion thereof. A corresponding one of the external input and output terminals 402 of the lower case 400 is fitted in the recessed region 216, thereby easily achieving electrical connection to the bus bar 202.

Figure 5:
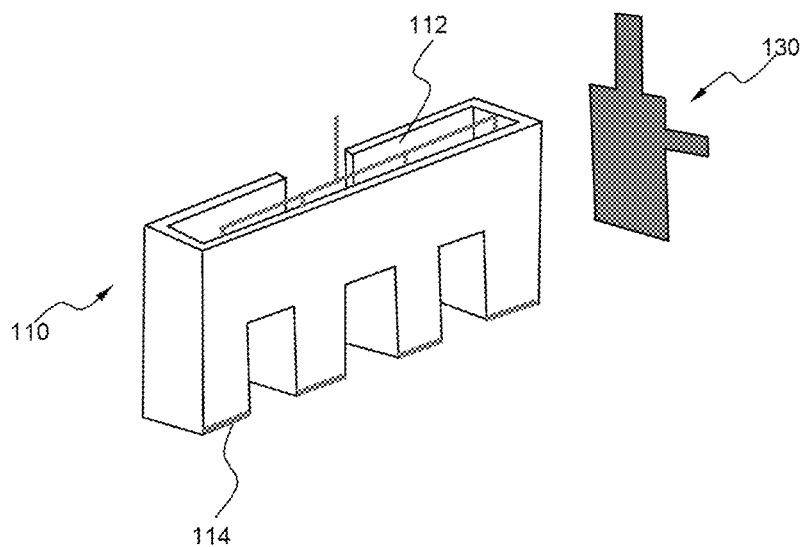
FIG. 5 is a perspective view of a rear measuring member and a battery module temperature measuring member in the battery module of FIG. 3.
Figure 6:
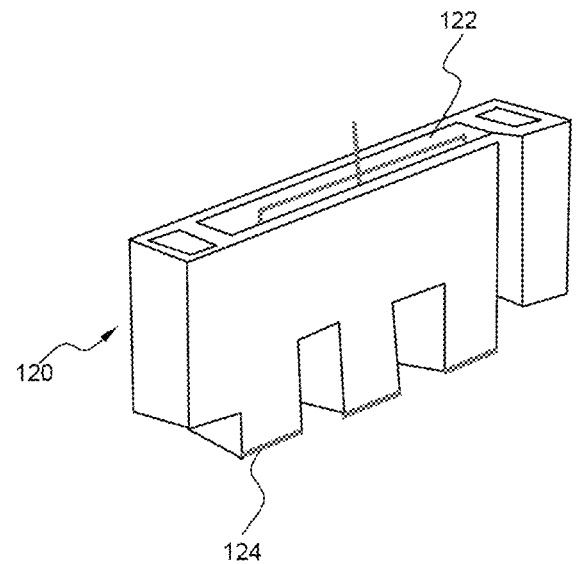
FIG. 6 is a perspective view of a front measuring member in the battery module of FIG. 3.

FIG. 5 is a schematic perspective view of the rear measuring member and the temperature measuring member in the battery module of FIG. 3 and FIG. 6 is a schematic perspective view of the front measuring member in the battery module of FIG. 3.

Referring to FIGS. 5 and 6 together with FIG. 4, the front measuring member 120 and the rear measuring member 110 include main bodies 122 and 112, each of which is formed in the shape of a connector having a hollow structure, and connection terminals 124 and 114 which are connected respectively to the bent series-connection portions (i.e., the electrode terminal connection parts) of the electrode terminals of the battery cells in a state in which the connection terminals 124 and 114 are fitted in the main bodies 122 and 112, respectively. That is, the connection terminals 114 and 124 are structured such that the ends of the connection terminals 114 and 124 are exposed to the outside through the lower ends of the main bodies 112 and 122 in a state in which the connection terminals 114 and 124 are fitted in the main bodies 112 and 122.

The lower portion of each of the main bodies 112 and 122 also has a divided structure such that the connection terminals 114 and 124 can be fitted into the main bodies 112 and 122, respectively, for the electrode terminal connection parts 204 of the battery cell stack 200. The connection terminals 114 and 124 have a receptacle structure such that the connection terminals 114 and 124 are inserted into the electrode terminal connection parts from above.

Specifically, the lower portion of the main body 122 of the front measuring member 120 is divided into three parts, which are connected to the electrode terminal connection parts 204 located at the front of the battery cell stack 220. The lower portion of the main body 112 of the rear measuring member 110 is divided into four parts, which are connected to the electrode terminal connection parts 206 located at the rear of the battery cell stack 220.

Figure 7:
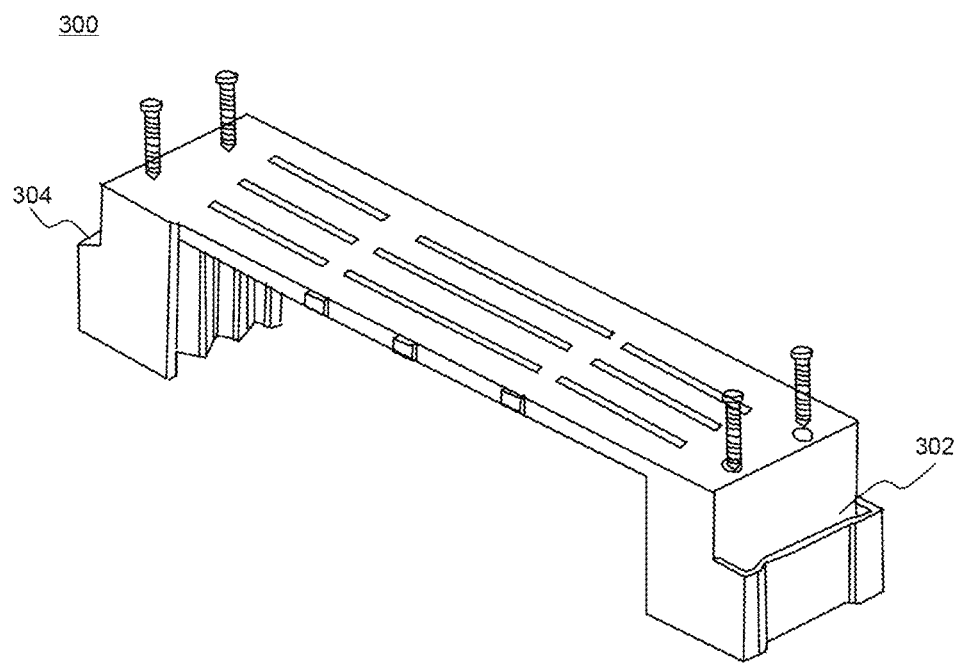
FIG. 7 is a perspective view of an upper case in the battery module of FIG. 3.
Figure 8:
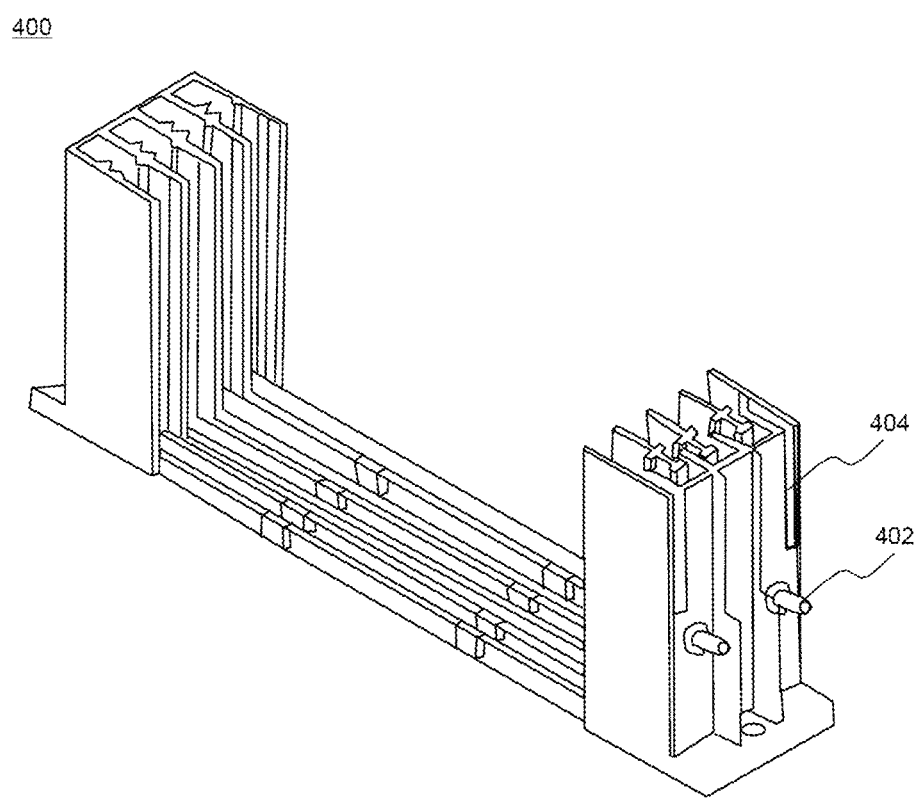
FIG. 8 is a perspective view of a lower case in the battery module of FIG. 3.

FIG. 7 is a schematic perspective view of the upper case of the battery module of FIG. 3 and FIG. 8 is a schematic perspective view of the lower case of the battery module of FIG. 3.

Referring to FIGS. 7 and 8 together with FIG. 3, the voltage measuring member mounting parts 302 for inserting and mounting the voltage measuring members 110 and 120 therein are formed respectively at the front and rear of the upper case 300 such that the voltage measuring member mounting parts 302 are upwardly open.

The lower case 400 is also provided at the front thereof with a pair of slits 404 for insertion of the bus bars 202 electrically connected to the outermost electrode terminals of the battery cell stack.

Figure 9:
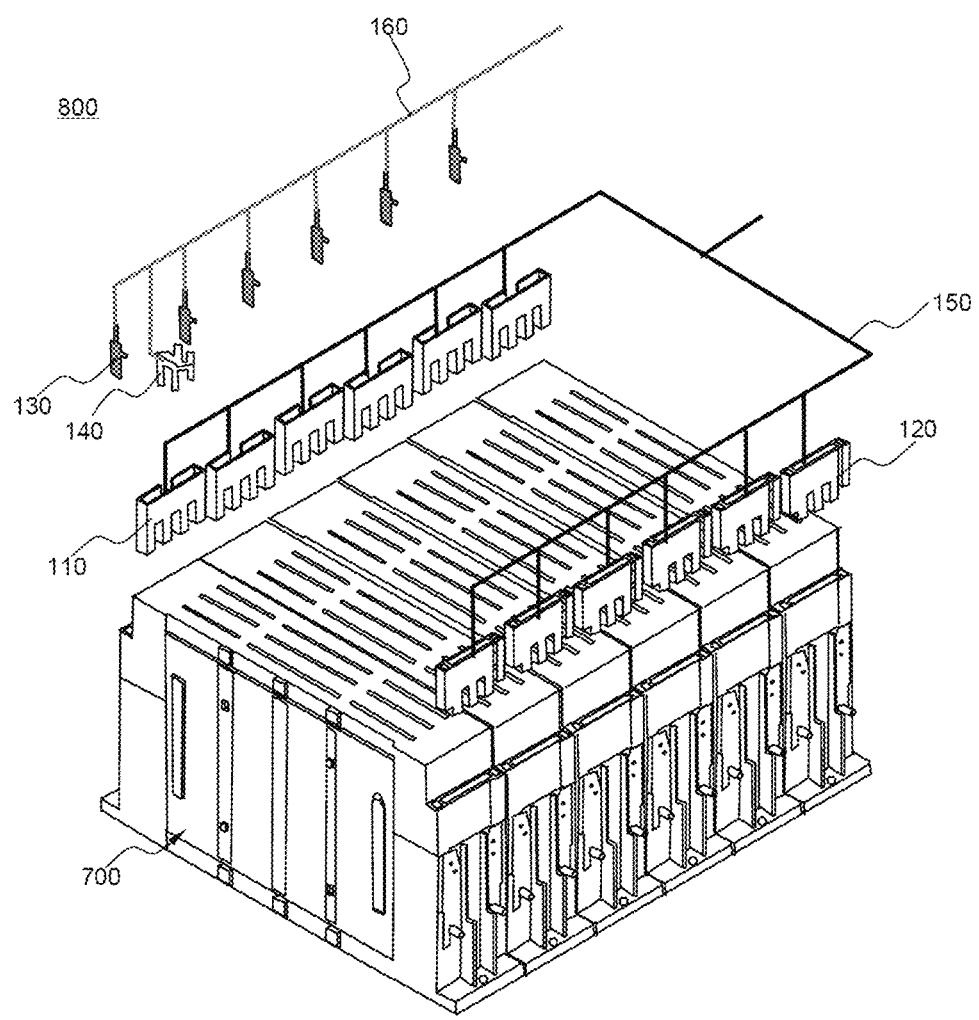
FIG. 9 is a perspective view of a middle or large-sized battery pack according to another embodiment of the present invention.

FIG. 9 is a schematic perspective view of a middle or large-sized battery pack according to another embodiment of the present invention.

As shown in FIG. 9, the battery pack 800 includes a plurality of battery modules 700 stacked in a lateral direction. Each of the battery modules 700 includes voltage measuring members 110 and 120 and a battery module temperature measuring member 130.

The voltage measuring members 110 and 120 and the battery module temperature measuring members 130 are electrically connected to a battery management system (BMS) (not shown) via wiring harnesses 150 and 160.

Since the wiring harnesses 150 and 160 are located above the battery pack 800, the wiring harness 150 and 160 are effectively prevented from being damaged by the battery pack 800 when external force such as vibration generated from a vehicle is applied to the battery pack 800.

In addition, the battery pack 800 includes an air temperature measuring member 140 for measuring air temperature at a coolant inlet portion of the battery pack 800. Thus, the battery pack 800 measures air temperature at the coolant inlet portion as well as temperatures of the battery modules 700.

In this structure, the voltage measuring members 110 and 120 are spatially separated from the temperature measuring members 130, thereby achieving the effects described above, which will be described below in more detail with reference to FIG. 10.

Figure 10:
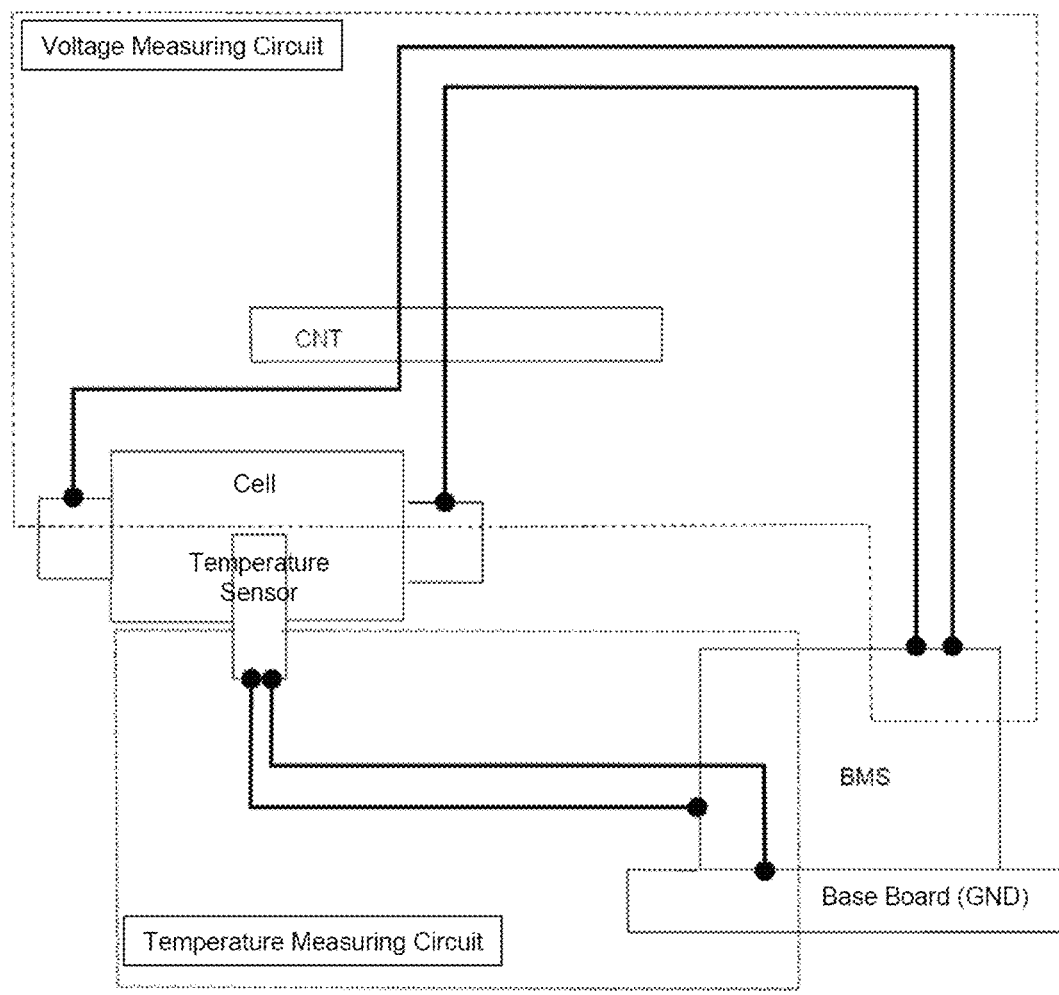
FIG. 10 is a schematic view of a voltage measuring circuit and a temperature measuring circuit according to the present invention.

FIG. 10 is a schematic view of a voltage measuring circuit and a temperature measuring circuit according to the present invention.

As can be seen from FIG. 10, the voltage measuring circuit is configured such that the voltage measuring member is connected to a BMS through a connector (CNT) and the temperature measuring circuit, which is separated from the voltage measuring circuit, is configured such that the temperature measuring member (temperature sensor) is directly connected to the BMS.

Figure 11:
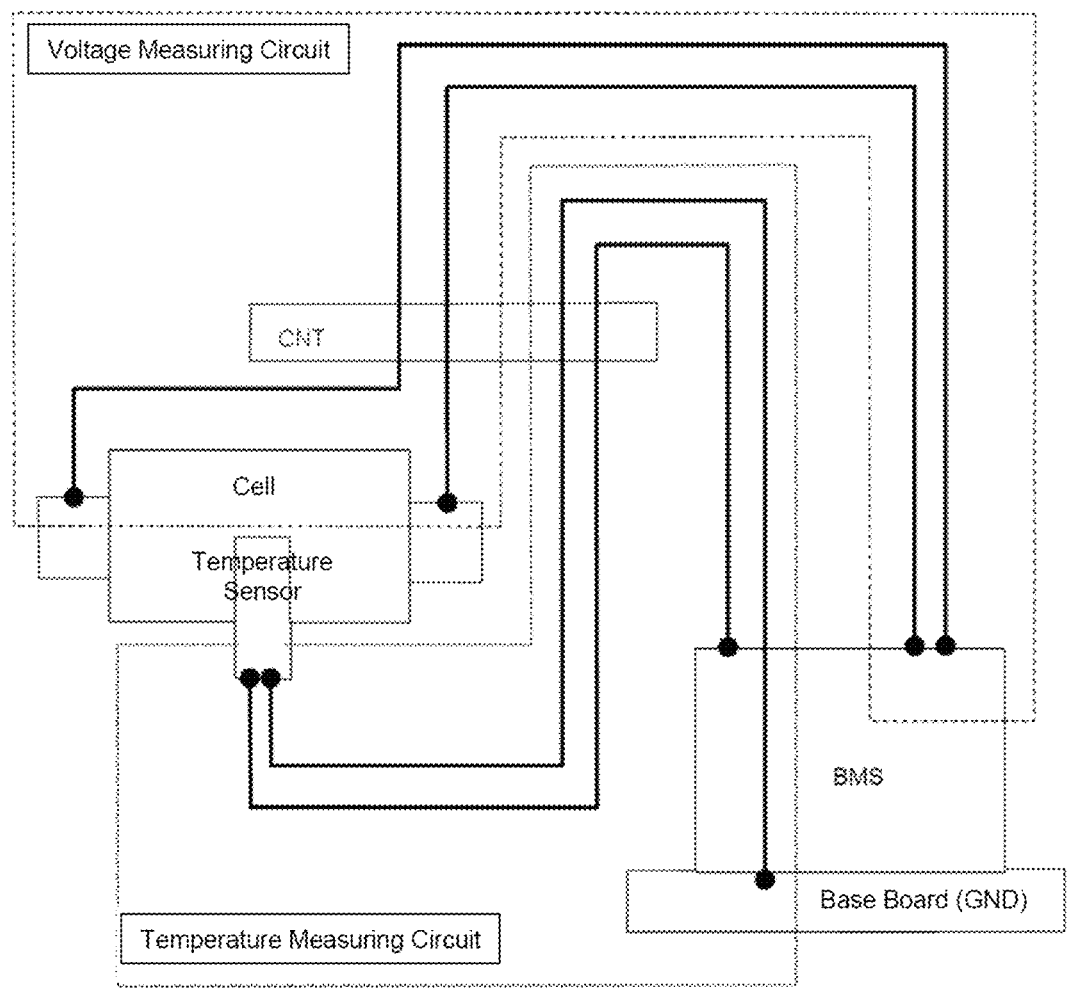
FIG. 11 is a schematic view of a voltage measuring circuit and a temperature measuring circuit according to the related art.

This configuration clearly differs from the conventional configuration of FIG. 11. That is, in the battery pack according to the present invention, which employs the configuration of FIG. 10, the insulation resistance of the voltage measuring circuit is not reduced by water and temperature measurements do not change, with the result that it is possible to correctly measure voltage and temperature.

Although the present invention has been described above with reference to the drawings which illustrate the embodiments of the present invention, it will be apparent to those skilled in the art that various modifications and variations are possible in light of the above teaching without departing from the scope of the invention.

INDUSTRIAL APPLICABILITY

As is apparent from the above description, in the battery pack according to the present invention, the voltage measuring circuit and the temperature measuring circuit are spatially separated from each other. Therefore, the insulation resistance of the voltage measuring circuit is not reduced by water and temperature measurements do not change, with the result that it is possible to correctly measure voltage and temperature.

Each of the voltage measuring members according to the present invention is manufactured through a simple assembly method without using a number of members for mechanical coupling and electrical connection. Therefore, it is possible to reduce manufacturing costs of the voltage measuring members and also to reliably measure voltage even when strong external impact or vibration is applied to the voltage measuring members.

In addition, it is possible to greatly improve productivity and maintenance of battery modules since each of the voltage measuring members according to the present invention is formed as a separate structure.

The invention claimed is:

1. A battery pack comprising:
   a battery module comprising:
   (a) a battery cell stack having a plurality of series-connected battery cells or unit modules which are stacked in a lateral direction with each battery cell or unit module oriented upright, the battery cell stack being provided at the front thereof with bus bars for connecting electrode terminals of the battery cells to external input and output terminals;
   (b) voltage measuring members provided at ends thereof with connection terminals that are electrically connected to electrode terminal connection parts of the battery cells located at the front and rear of the battery cell stack to measure voltages of the battery cells or the unit modules;
   (c) an upper case that covers the top of the battery cell stack and parts of the front and rear of the battery cell stack, the upper case being provided with mounting parts for inserting and mounting the voltage measuring members therein, wherein the mounting parts are formed respectively at a front upper part and a rear upper part of the upper case such that the mounting parts are upwardly open; and
   (d) a lower case coupled to the upper case while covering the bottom of the battery cell stack and parts of the front and rear of the battery cell stack, the lower case being provided at the front thereof with external input and output terminals;
   a voltage measuring member that measures voltage at an electrode terminal connection part of the battery cells or the unit modules;
   a voltage measuring circuit that connects the voltage measuring member to a Battery Management System (BMS);
   a temperature measuring member that measures temperature of the battery cells or the unit modules, wherein the temperature measuring member is mounted between the battery cells or the unit modules;

a temperature measuring circuit that connects the temperature measuring member to the BMS, the temperature measuring circuit being separated from the voltage measuring circuit, wherein the temperature measuring circuit is spatially separated from the voltage measuring circuit; and the BMS electrically connected to the voltage measuring member to control operation of the battery module.

2. The battery pack according to claim 1, wherein the at least two battery cells are structured such that electrode terminals of the battery cells are connected in series and a connection portion between the electrode terminals is bent so that the battery cells are arranged in a stacked structure.

3. The battery pack according to claim 1, wherein each of the unit modules comprises a pair of module covers that are coupled to each other to cover an entire outside of a battery cell excluding electrode terminals of the battery cell.

4. The battery pack according to claim 1, wherein the voltage measuring members comprise a front measuring member connected to the electrode terminal connection parts located at the front of the battery cell stack and a rear measuring member connected to the electrode terminal connection parts located at the rear of the battery cell stack.

5. The battery pack according to claim 1, wherein the lower case is provided at the front thereof with a pair of slits for inserting therethrough bus bars connected to outermost electrode terminals of the battery cells.

6. The battery pack according to claim 1, wherein a front cover comprising an insulating material is provided at the front of the upper case to close a corresponding one of the voltage measuring members, which are upwardly open, from outside.

7. The battery pack according to claim 1, wherein the battery cell is a plate-shaped battery cell having electrode terminals formed respectively at upper and lower ends of the battery cell.

8. The battery pack according to claim 7, wherein each of the battery cells is structured such that a case formed of a laminate sheet comprising a metal layer and a resin layer is sealed around a perimeter of the case after an electrode assembly is mounted in the case.

9. The battery pack according to claim 1, wherein the temperature measuring circuit comprises a line of a voltage lower than a line of the voltage measuring circuit.

10. The battery pack according to claim 9, wherein the temperature measuring circuit comprises a line of 2 to 7V.

11. The battery pack according to claim 1, wherein the upper case has slits for coolant circulation at the top thereof and the temperature measuring circuit is connected to the temperature measuring member mounted between the battery cells or the unit modules through the slits.

12. The battery pack according to claim 11, wherein each of the temperature measuring members comprises a thermistor.

13. The battery pack according to claim 1, wherein each of the bus bars comprises an electrode terminal contact portion electrically connected to a corresponding one of the outermost electrode terminals of the battery module and an input and output terminal contact portion connected to a corresponding one of the external input and output terminals of the lower case, the input and output terminal contact portion being bent substantially perpendicular to the electrode terminal contact portion toward an interior of the battery module.

14. The battery pack according to claim 13, wherein the input and output terminal contact portion is provided at a lower portion thereof with an inwardly recessed region and a corresponding one of the external input and output terminals is fitted in the recessed region to be electrically connected to the bus bar.

15. A vehicle comprising the battery pack according to claim 1 as a power source.

16. The vehicle according to claim 15, wherein the vehicle is an electric vehicle, a hybrid electric vehicle or a plug-in hybrid electric vehicle.

17. The battery pack according to claim 1, wherein each of the voltage measuring members comprises a main body formed in the shape of a connector having a hollow structure and connection terminals connected to the electrode terminal connection parts in a state in which the connection terminals are fitted in the main body.

18. The battery pack according to claim 17, wherein a lower portion of the main body has a divided structure such that the connection terminals are fitted in the main body, respectively, for the electrode terminal connection parts.

19. The battery pack according to claim 17, wherein the connection terminals have a receptacle structure such that the connection terminals are inserted into the electrode terminal connection parts from above.

\* \* \* \* \*